(12) United States Patent
Chiu et al.

(10) Patent No.: US 9,666,588 B2
(45) Date of Patent: May 30, 2017

(54) DAMASCENE NON-VOLATILE MEMORY CELLS AND METHODS FOR FORMING THE SAME

(71) Applicant: TAIWAN SEMICONDUCTOR MANUFACTURING CO., LTD., Hsin-Chu (TW)

(72) Inventors: Hung-Yu Chiu, Tainan (TW); Hung-Che Liao, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/733,991

(22) Filed: Jun. 9, 2015

(65) Prior Publication Data

US 2015/0270275 A1    Sep. 24, 2015

Related U.S. Application Data

(62) Division of application No. 13/535,613, filed on Jun. 28, 2012, now Pat. No. 9,076,727.

(51) Int. Cl.
| | |
|---|---|
| *H01L 27/115* | (2006.01) |
| *H01L 27/11521* | (2017.01) |
| *H01L 21/28* | (2006.01) |
| *H01L 29/66* | (2006.01) |
| *H01L 27/11568* | (2017.01) |
| *H01L 29/788* | (2006.01) |
| *H01L 21/225* | (2006.01) |
| *H01L 21/265* | (2006.01) |
| *H01L 21/285* | (2006.01) |
| *H01L 29/49* | (2006.01) |
| *H01L 29/51* | (2006.01) |

(52) U.S. Cl.
CPC .... *H01L 27/11521* (2013.01); *H01L 21/2254* (2013.01); *H01L 21/26586* (2013.01); *H01L 21/28273* (2013.01); *H01L 21/28282* (2013.01); *H01L 21/28525* (2013.01); *H01L 27/11568* (2013.01); *H01L 29/4916* (2013.01); *H01L 29/513* (2013.01); *H01L 29/518* (2013.01); *H01L 29/66825* (2013.01); *H01L 29/66833* (2013.01); *H01L 29/7881* (2013.01)

(58) Field of Classification Search
CPC ......... H01L 29/66825; H01L 21/28114; G11C 16/0433
USPC ......... 438/593, 393, 266; 257/316, 315, 532
See application file for complete search history.

(56) References Cited

U.S. PATENT DOCUMENTS

| | | | | |
|---|---|---|---|---|
| 2007/0264779 A1* | 11/2007 | Hsiao | ................... | H01L 27/115 438/266 |
| 2009/0086540 A1* | 4/2009 | Hung | ................. | G11C 16/0433 365/185.05 |

(Continued)

*Primary Examiner* — Jerome Jackson, Jr.
*Assistant Examiner* — Bo Fan
(74) *Attorney, Agent, or Firm* — Duane Morris LLP

(57) ABSTRACT

A non-volatile memory cell formed using damascene techniques includes a floating gate electrode that includes a recess lined with a control gate dielectric and filled with the control gate electrode material. The control gate material is a composite ONO, oxide-nitride-oxide sandwich dielectric in one embodiment. The floating gate transistors of the non-volatile memory cell include a high gate coupling ratio due to the increased area between the floating gate electrode and the control gate electrode.

18 Claims, 9 Drawing Sheets

(56) References Cited

U.S. PATENT DOCUMENTS

| | | | | |
|---|---|---|---|---|
| 2009/0087976 A1* | 4/2009 | Hendriks | ........ | H01L 21/28273 438/593 |
| 2009/0321806 A1* | 12/2009 | Mei | ........ | H01L 21/28114 257/315 |
| 2011/0115012 A1* | 5/2011 | Jiang | ........ | H01L 29/42336 257/316 |
| 2011/0269291 A1* | 11/2011 | Ueno | ........ | H01L 21/28273 438/393 |
| 2012/0068307 A1* | 3/2012 | Kawashima | ........ | H01L 27/0629 257/532 |
| 2012/0069651 A1* | 3/2012 | Lee | ........ | G11C 16/0416 365/185.2 |

\* cited by examiner

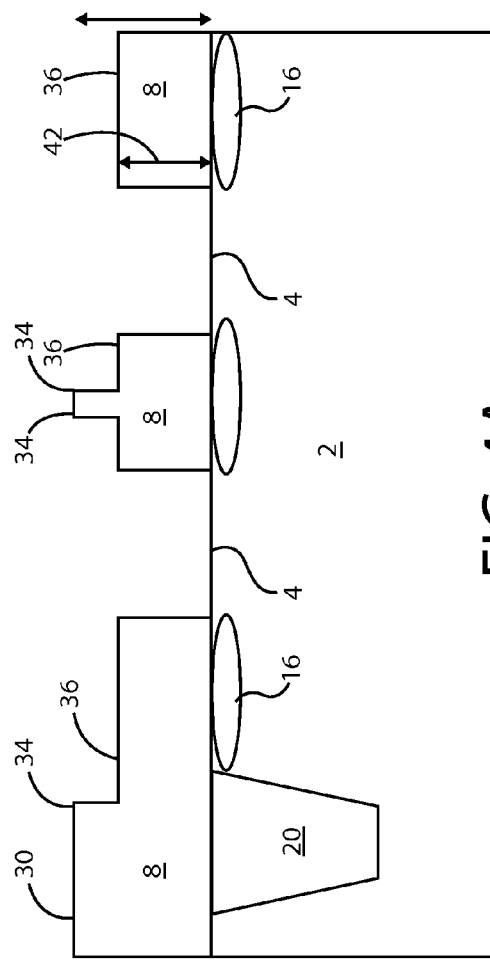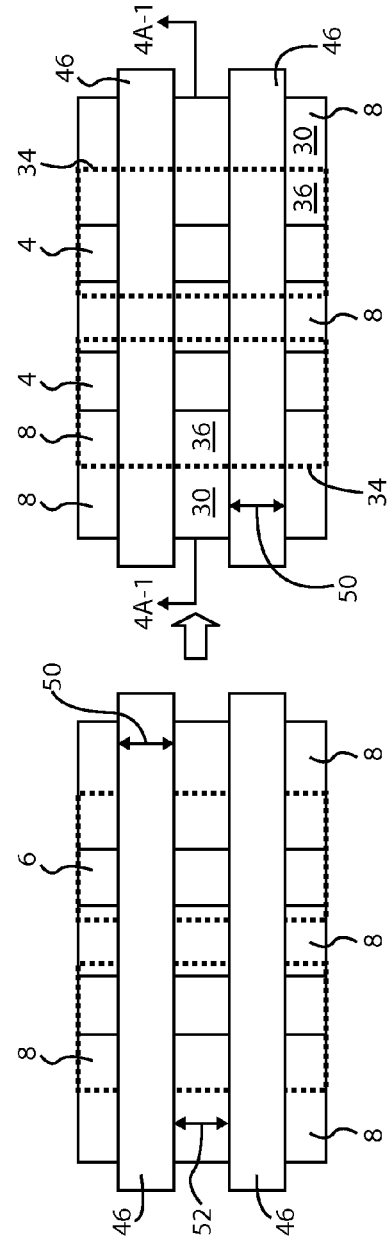
FIG. 4A
FIG. 4B-1
FIG. 4B-2 the various features are arbitrarily expanded or reduced for clarity. Like numerals denote like features throughout the specification and drawing.

DAMASCENE NON-VOLATILE MEMORY CELLS AND METHODS FOR FORMING THE SAME

CROSS-REFERENCE TO RELATED APPLICATIONS

This application is a divisional of U.S. patent application Ser. No. 13/535,613, filed Jun. 28, 2012, the contents of which is hereby incorporated by reference as if set forth in its entirety.

TECHNICAL FIELD

The disclosure relates to semiconductor devices and, more particularly, to non-volatile memory cells and floating gate transistors, and methods for forming the same.

BACKGROUND

Memory cells, and in particular, non-volatile memory cells are widely used in countless electronics devices. Non-volatile memory cells utilize floating gate transistors, which are transistors that include a channel, source/drain regions, and both a control gate and a floating gate. The floating gate is disposed in a dielectric material between the control gate and the subjacent channel formed in a substrate.

In the manufacture of non-volatile memory cells and all semiconductor devices, there is a continued drive to increase levels of integration, a corollary of which is to reduce device feature size and increase the concentration of functional devices within a given area. It is challenging to manufacture a large number of floating gate transistors in close proximity because of their complexity. Limitations in photolithography and etching processes restrict the levels of integration, i.e., the reduction in device feature size and spacing, obtainable using lithography and etch processes. The lithography and etch processes typically used to form floating gate transistors on semiconductor substrates often produce stringers that undesirably short the floating gates together.

It is also a challenge to effectively increase the area of the floating gate so as to desirably enlarge the GCR, gate coupling ratio, of the transistors. A large GCR is typically associated with a larger floating gate electrode, which unfortunately requires more space and decreases levels of integration.

It would be desirable to produce non-volatile memory cells and floating gate transistors at high levels of integration and with high gate coupling ratios, without experiencing the aforementioned shortcomings.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 1 and FIGS. 2A, 3A, 4A, 5, 6A, 7A and 8 are cross sectional views that show a sequence of processing operations used to form floating gate transistors according to an embodiment of the disclosure.

FIGS. 4B-1 and 4B-2 are top views showing a sequence of processing operations used to form the structure shown in cross-section in FIG. 4A.

DETAILED DESCRIPTION

The disclosure provides for using damascene and other technologies to form an array of floating gate transistors used in non-volatile memory cells. The floating gate transistors each include a floating gate electrode of increased area. The floating gate electrode includes vertical portions and horizontal portions that combine to form a trench in the floating gate electrode thereby increasing the floating gate electrode area. The floating gate with increased area is not achievable using other methods, such as methods that do not utilize damascene technology. Portions of the control gate extend down into the trench and increase the gate coupling ratio, GCR. The control gate is formed in confronting relation with the upper surface of the floating gate electrode which includes vertical surface portions and horizontal surface portions. The GCR is defined as follows.

$$GCR = C_{control\text{-}gate\ electrode}/C_{total}$$

The disclosure provides a sequence of processing operations that form an array of floating gate transistors that are high functioning, highly integrated, and include a high GCR. The increased GCR is achieved without increasing the footprint, i.e., the lateral size of the floating gate electrode.

Figure 1:
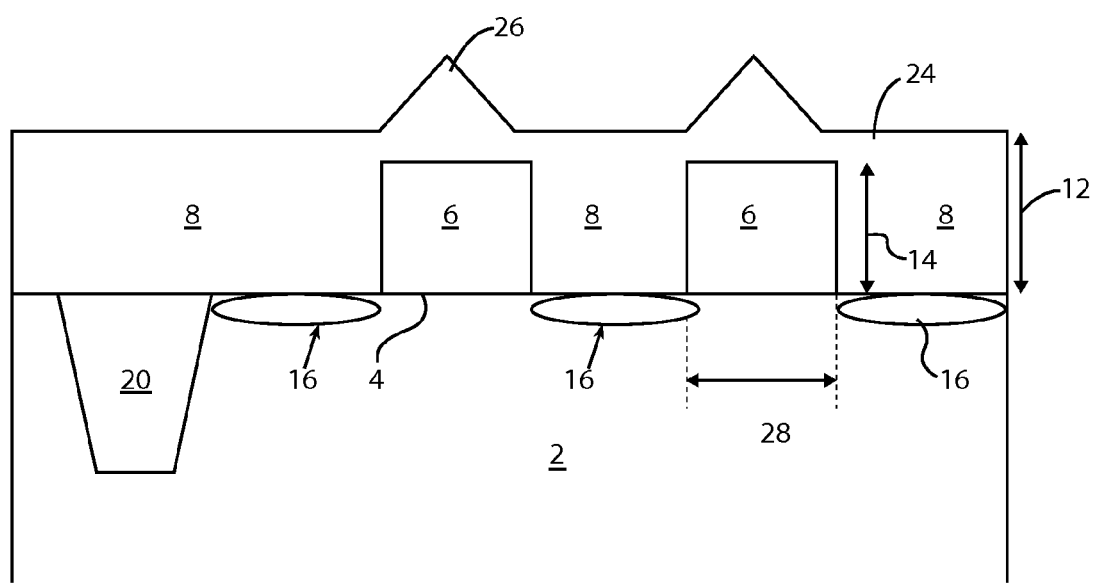

FIG. 1 shows an early step in the sequence of processing operations used to form floating gate transistors according to the disclosure. Substrate 2 includes substrate surface 4. Substrate 2 is a silicon substrate in one embodiment. In other embodiments, other suitable semiconductor materials are used for substrate 2. Nitride portions 6 and oxide 8 combine to form a dielectric layer over substrate surface 4. Nitride portions 6 may be silicon nitride in stoichiometric or other proportions. The discrete sections of nitride portions 6 are formed by first depositing a layer of nitride over substrate surface 4 and then using patterning and etching techniques to produce the discrete nitride portions 6 shown in FIG. 1. Width 28 of nitride portions 6 ranges from about 0.13 um to about 40 nm in various embodiments, but other widths are used in other embodiments.

Oxide 8 is silicon dioxide in one embodiment but other suitable oxide materials are used in other embodiments. Implant regions 16 are formed in substrate 2 between nitride portions 6. Implant regions 16 may be BD, barrier diffusion, implant areas that are formed after nitride portions 6 have been defined and prior to the disposition of oxide 8. In one embodiment, implant regions 16 are subsequently annealed using RTA. A temperature of 800° C. is used in one embodiment, but other temperatures are used in other embodiments. In some embodiments, implant regions 16 include a Latid (large angle tilt implanted drain) implant carried out subsequent to the formation of the BD implant and RTA.

Oxide 8 is formed using HDP, high density plasma, deposition methods in some embodiments. Other methods are used in other embodiments. Oxide 8 is formed subsequent to nitride portions 6 and includes thickness 12 greater than thickness 14 of nitride portions 6. Thickness 14 is 2100 angstroms in one embodiment, but thickness 14 ranges from about 1000 angstroms to 3000 angstroms in other embodiments. In one embodiment, thickness 12 is 2500 angstroms and in other embodiments, thickness 12 ranges from about 1500 angstroms to about 3500 angstroms. Protrusions 26 of oxide 8 are formed over nitride portions 6 due to the conformal nature of the deposition process used to form oxide 8. STI structure 20 is formed within substrate 2 to isolate active features such as the floating gate transistors that will be formed, from other active features.

Figure 2A:
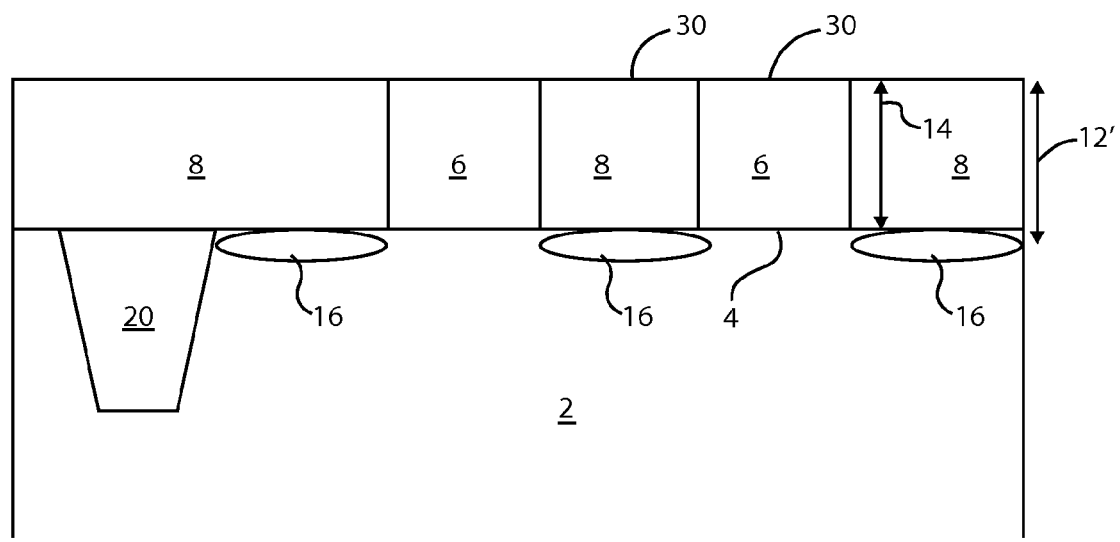
Figure 2B:
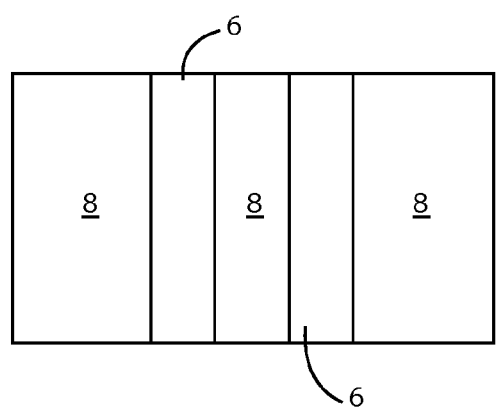
FIG. 2B is a plan, top view corresponding to FIG. 2A

A damascene-type planarization process is then carried out upon the structure shown in FIG. 1 to produce the structure shown in FIGS. 2A and 2B. Chemical mechanical polishing, CMP, or other suitable polishing operations are used to recede the top surfaces of oxide 8 in FIG. 1 to produce planar top surface 30 shown in FIG. 2A. Planar top surface 30 includes co-planar portions of nitride portions 6 and oxide 8. Reduced thickness 12' of oxide 8 is now identical to thickness 14 of nitride portions 6. In one embodiment, thickness 12' and thickness 14 are each 2100 angstroms and about 400-500 angstroms of oxide 8 is removed. FIG. 2B is a top view of the structure shown in FIG. 2A and shows nitride portions 6 and oxide 8.

Figure 3A:
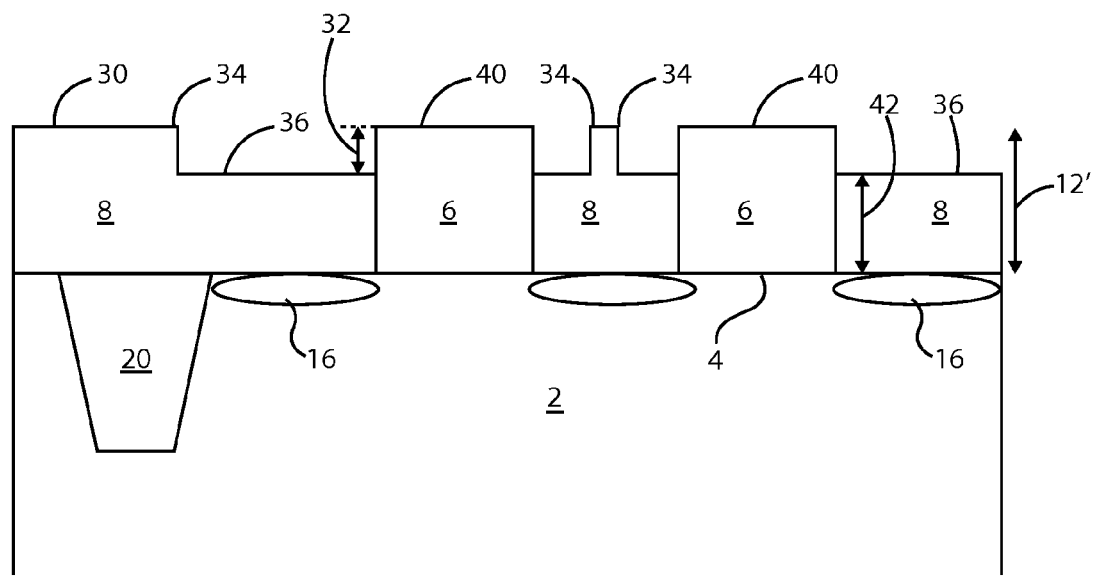
Figure 3B:
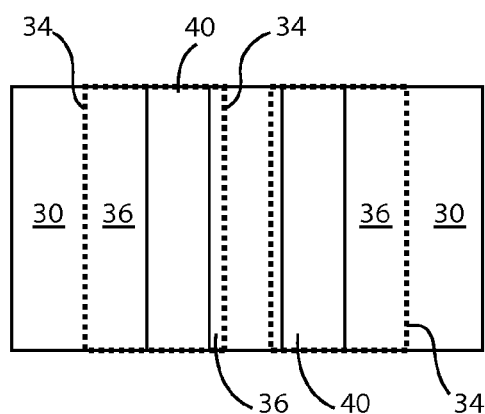
FIG. 3B is a plan, top view corresponding to FIG. 3A.

FIGS. 3A and 3B show the structure of FIG. 2A after a patterning operation has been used to recede portions of oxide 8. A photolithographic patterning operation is used to form a photoresist pattern over the structure of FIG. 2A and then an etching operation is used to selectively remove exposed portions of oxide 8 that are not covered by the masking pattern. Various suitable wet and dry oxide etching operations are available and are used in various embodiments. Exposed portions of oxide 8 are removed to depth 32 to produce recessed surface 36. The selective etching operation does not etch nitride portions 6, leaving nitride portions 6 having upper surfaces 40 that protrude above recessed surface 36. The structure shown in FIGS. 3A and 3B represent the structure produced after the photoresist masking pattern has been removed. In one embodiment, depth 32 is 500 angstroms. In other embodiments, depth 32 ranges from about 200 angstroms to about 1500 angstroms. Remaining thickness 42 is 1600 angstroms in one embodiment. Remaining thickness 42 depends upon depth 32 and ranges from 1000-2200 angstroms or other thicknesses in other embodiments. The recessed portions are defined by edges 34. FIG. 3B is a plan, top view showing the structure of FIG. 3A and shows planar top surface 30 and recessed surface 36 of oxide 8 as well as top surface 40 of nitride portions 6. Edges 34 indicate the bounds of the recessed portions.

FIG. 4A shows the structure of FIG. 3A after a selective etching operation is used to remove nitride portions 6 that are uncovered by a masking layer formed in a patterning operation. FIGS. 4B-1 and 4B-2 are top views showing a sequence of processing operations used to form the structure shown in cross-section in FIG. 4A. After masking pattern 46 is formed using a photolithography patterning process, a selective etching operation is used to remove exposed sections of nitride portions 6. Width 50 of masking pattern 46 is about 0.6 um in one embodiment and ranges from about 0.3 to about 1 um in other embodiments. Line spacing 52 is about 0.6 um in one embodiment and may lie within the range of about 0.3 to 1.0 um in other embodiments. With exposed sections of nitride portions 6 removed, substrate surface 4 is exposed. FIG. 4B-2 shows planar top surface 30 and recessed surface 36 of oxide 8 as well as substrate surface 4. FIG. 4A represents the cross-section taken along line 4A-4A of FIG. 4B-2. Various suitable wet or dry selective nitride etching operations are used in various embodiments.

Figure 5:
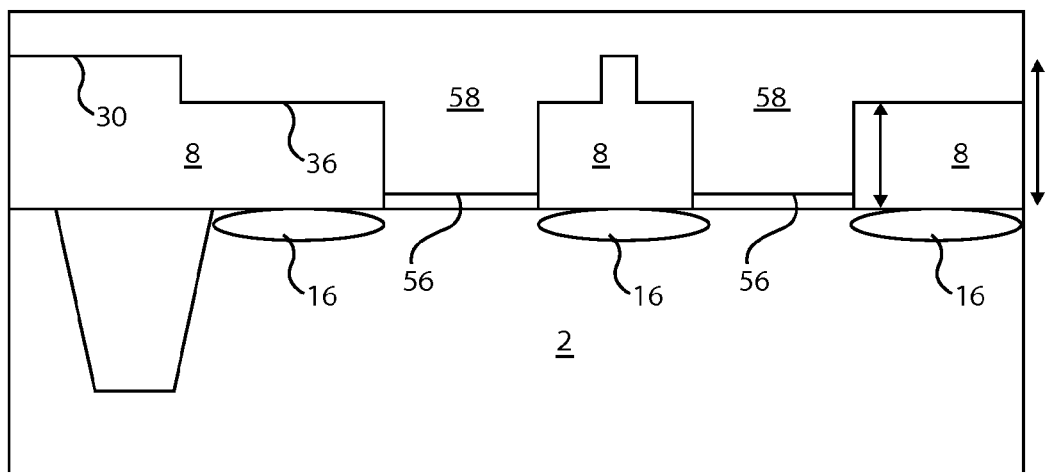

FIG. 5 shows the structure of FIG. 4A, which represents a cross-section taken between unremoved, remaining nitride portions 6, after a tunnel oxide and floating gate electrode material have been formed over the structure of FIG. 4A. Tunnel oxide 56 includes a thickness of 50-100 angstroms in one embodiment, but other thicknesses are used in other embodiments. Tunnel oxide 56 is formed using various oxidation methods and, in one embodiment, tunnel oxide 56 is formed using in-situ single wafer growth, ISSG, methods. Floating gate electrode material 58 is polysilicon in one embodiment. Other suitable floating gate electrode materials are used in other embodiments. Floating gate electrode material 58 includes a thickness of about 1000 angstroms in one embodiment but other thicknesses are used in other embodiments. Floating gate electrode material 58 fills the two-tiered openings of FIG. 4A and extends down to tunnel oxide 56. Floating gate electrode material 58 is doped in one embodiment and undoped in other embodiments. As formed, floating gate electrode material 58 covers planar top surface 30 as well as recessed surface 36 of oxide 8.

Figure 6A:
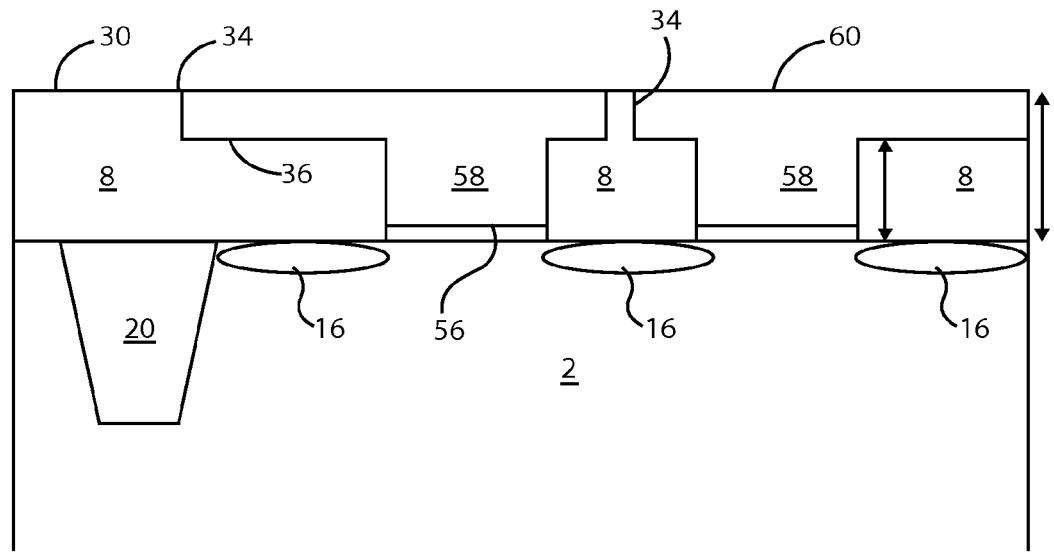
Figure 6B:
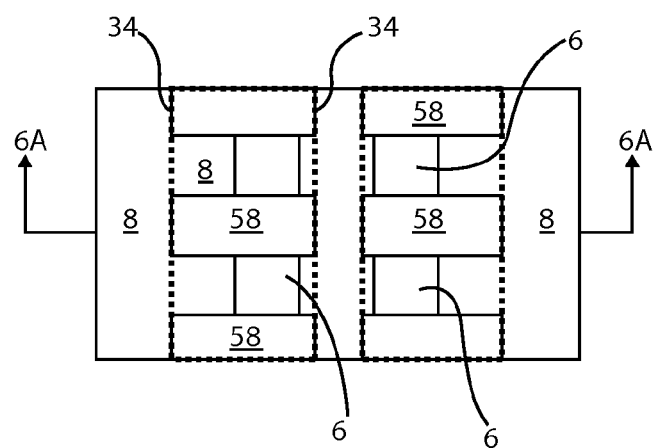
FIG. 6B is a plan, top view corresponding to FIG. 6A.

A CMP operation or another suitable polishing operation is then carried out upon the structure shown in FIG. 5, to produce the structure shown in FIG. 6A and 6B. After polishing, upper surface 60 of floating gate electrode material 58 is co-planar with planar top surface 30. FIGS. 6A and 6B also show that floating gate electrode material 58 is formed into discrete, separated portions after polishing. FIG. 6B is a top view that shows that the discrete portions of floating gate electrode material 58 are arranged along horizontal rows and separated by oxide 8 and unremoved nitride portions 6. FIG. 6A represents a cross-section taken along line 6A-6A of FIG. 6B.

Figure 7A:
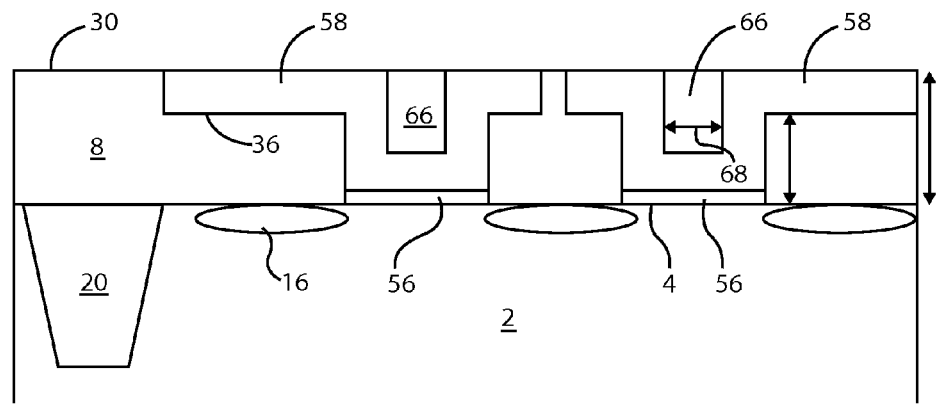
Figure 7B:
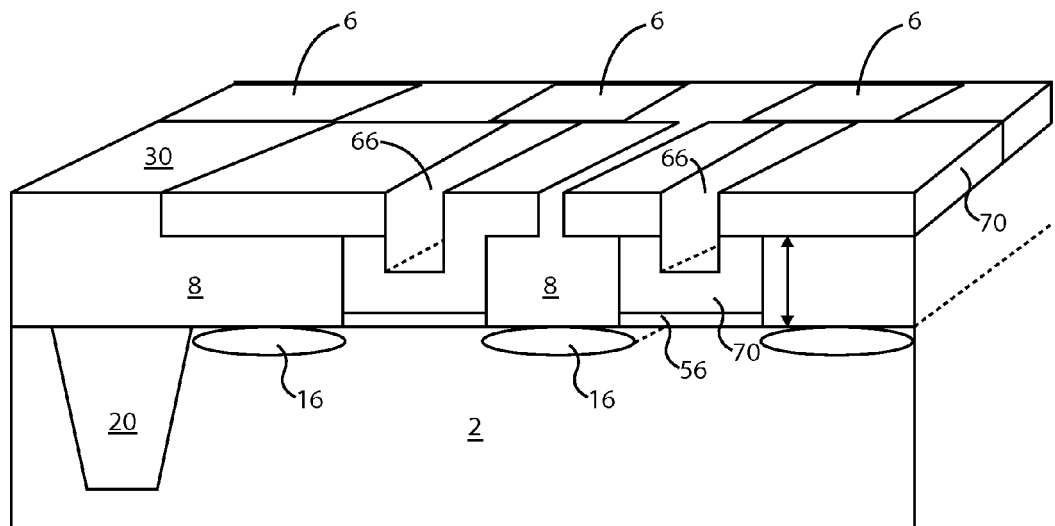
FIG. 7B is a three-dimensional perspective view of the structure of FIG. 7A.

FIG. 7A and FIG. 7B show trenches formed in the structure of FIG. 6A. Trenches 66 are formed using a patterning operation and an etching operation that etches uncovered portions of floating gate electrode material 58. Trenches 66 include width 68 can range from 0.1 to several um in various embodiments. Various polysilicon etching operations are available and are used according to the embodiment in which floating gate electrode material 58 is polysilicon. The discrete portions of floating gate electrode material 58 that fill the former two-tiered opening and include centrally located trench 66 serve as floating gate electrodes. Floating gate electrodes 70 are shown in the 3-dimensional, perspective view of FIG. 7B. Floating gate electrodes 70 include vertical and horizontal sections. Floating gate electrodes 70 are laterally separated by oxide 8 along the x-direction and are separated from additional rows of floating gate electrodes 70 in the y-direction by oxide 8 and nitride portions 6.

Figure 8:
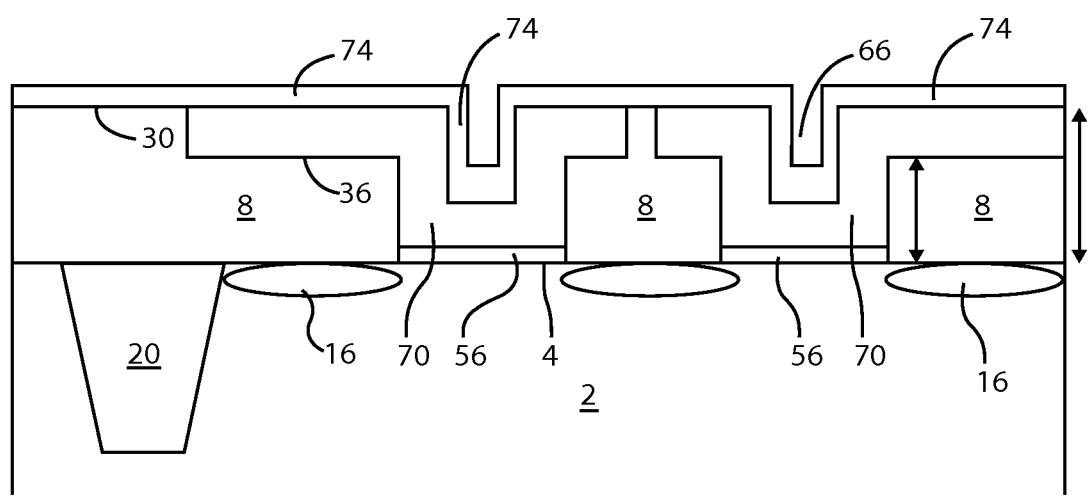

FIG. 8 shows the structure of FIG. 7A after control gate dielectric 74 has been formed over the structure shown in FIG. 7A. Control gate dielectric 74 is disposed over floating gate electrodes 70 and lines the sidewalls and bottom of trenches 66. In one embodiment, control gate dielectric 74 is a composite of three layers. In one embodiment, control gate dielectric is an ONO dielectric, i.e. a sandwich structure including an oxide layer over a nitride layer over another oxide layer. Other control gate dielectric materials are used in other embodiments. The thickness of control gate dielectric 74 ranges from 100 angstroms to 500 angstroms in various embodiments. Control gate dielectric 74 does not completely fill trenches 66.

Figure 9A:
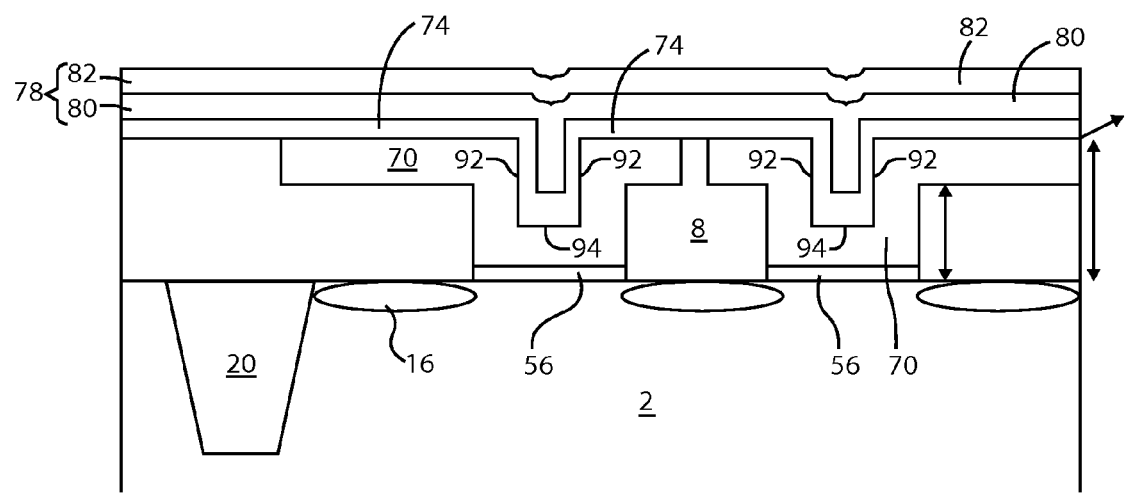
Figure 9B:
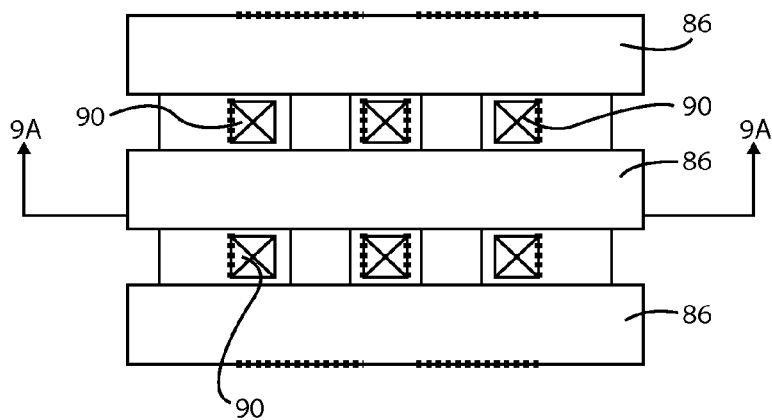

FIGS. 9A and 9B show the structure of FIG. 8 after a control gate material has been formed and patterned. Control gate material 78 includes control gate poly 80 and silicide 82 in the illustrated embodiment but other materials and other combinations of material layers are used in other embodiments. Silicide 82 is CoSi in one embodiment but other silicides are used in other embodiments. In one embodiment, silicide 82 is formed by depositing a metal layer such as cobalt or copper over control gate poly 80 and then heating to form a silicide. Control gate material 78 extends into and fills trenches 66 lined with control gate dielectric 74 such as most recently shown in FIG. 8. Control gate material 78 is formed as a blanket material and is then patterned using photolithography and etching operations that terminate at control gate dielectric 74.

FIG. 9B shows control gates 86 formed of patterned control gate material 78. Each control gate 86 extends along the x-direction. Respective control gates 86 are separated from one another in the y-direction. Each control gate 86 is electrically coupled to each of the floating gate transistors that include floating gate electrodes 70 that are otherwise laterally isolated from one another along the x-direction. It should be understood that the structure shown in the top view of FIG. 9B represents a small part of a large array including floating gate transistors including floating gate electrodes 70 arranged along the x-direction and coupled using control gate 86. Contacts 90 are formed through oxide 8 and provide contact to implant areas 16 which serve as the source/drain regions of the floating gate transistors that are formed to include floating gate electrode 70, tunnel oxide 56, control gate dielectric 74 and control gate 86. The transistor channel is disposed beneath tunnel oxide 56 and between implant areas 16. FIG. 9A is a cross-sectional view taken along line 9A-9A of FIG. 9B and shows a portion of an array including discrete floating gate electrodes 70 sharing a common control gate The floating gate transistors formed according to the disclosed sequence of processing operations and shown in FIG. 9A, include an increased GCR due to the increased area between floating gate electrode 70 and control gate 86. This is due, in part, to the central recess in floating gate electrodes 70 that includes control gate dielectric 74 lining sidewalls 92 and bottom 94 of the recess and the portions of control gate material 78 that fills the recesses. Control gate material 78 is separated from floating gate electrode 70 by control gate dielectric 74 and opposed floating gate electrode 70 along sidewalls 92, bottom 94 and top surface 96. As such, the GCR is increased for the floating gate transistor formed according to the disclosure, in comparison to other floating gate transistors having the same lateral footprint but not including trench 66.

According to one aspect, a semiconductor device including a plurality of floating gate transistors, is provided. Each floating gate transistor comprises: a floating gate electrode disposed over a tunnel oxide disposed over a channel, the floating gate electrode having an opening extending downwardly from a top surface thereof and the opening having a bottom surface in the floating gate electrode; a floating gate dielectric disposed over the floating gate electrode and lining the opening; and a control gate electrode disposed over the floating gate electrode and filling the opening.

According to another aspect, a method for forming floating gate transistors is provided. The method comprises: forming floating gate electrodes by depositing polysilicon that fills openings in a dielectric layer, each opening having a bottom including a tunnel oxide disposed over a substrate; forming a recess in each floating gate electrode, each recess including sidewalls and a bottom surface within the floating gate electrode; forming a floating gate dielectric layer along the sidewalls and the bottom surface of each of the recesses; and forming a control gate electrode on the floating gate dielectric layer and filling each of the recesses.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for forming floating gate transistors, said method comprising:

forming a dielectric layer over a substrate, said dielectric layer including oxide portions and nitride portions, said nitride portions and oxide portions having coplanar upper surfaces;

recessing said oxide portions in a first region that includes said nitride portions such that said nitride portions protrude above recessed oxide portions in said first region; and thereafter, removing sections of said nitride portions to form openings in said first region, wherein each said opening comprises a two-tiered opening with a central portion having a bottom terrace and an upper terrace adjacent said central portion;

forming floating gate electrodes by depositing polysilicon that fills said openings in said dielectric layer, each said opening having a bottom including a tunnel oxide disposed over a substrate;

forming a recess in each said floating gate electrode, each said recess including sidewalls and a bottom surface within said floating gate electrode;

forming a floating gate dielectric layer along said sidewalls and said bottom surface of each of said recesses; and forming a control gate electrode on said floating gate dielectric layer and filling each of said recesses.

2. The method as in claim 1, wherein said forming gate electrodes by depositing polysilicon includes depositing said polysilicon over said dielectric layer then polishing to remove said polysilicon from over a top surface of said dielectric layer and said forming a recess comprises patterning and etching said polysilicon after said polishing.

3. The method as in claim 1, wherein said forming said dielectric layer includes forming said discrete nitride portions by patterning a nitride layer then depositing said oxide over said substrate and said discrete nitride portions using HDP (high density plasma) and thereafter polishing to form said coplanar upper surfaces.

4. The method as in claim 1, wherein said removing sections of said nitride portions includes forming a masking pattern over said dielectric layer wherein said sections of said nitride portions are not covered by said masking pattern, and etching to selectively remove said sections of said nitride portions, wherein further nitride portions covered by said masking pattern remain unremoved.

5. The method as in claim 4, further comprising implanting dopant impurities into said substrate between said discrete nitride portions using at least one of a barrier diffusion implant and a large angle tilt implanted drain (Latid) implant, prior to said then depositing said oxide over said substrate.

6. The method as in claim 1, wherein said forming a floating gate dielectric layer comprises forming an oxide layer, forming a nitride layer over said oxide layer and forming a further oxide layer over said nitride layer.

7. The method as in claim 1, wherein said control gate electrode couples more than one of said floating gate electrodes.

8. The method as in claim 7, wherein said floating gate electrodes are laterally separated along a first direction by said dielectric layer, said control gate electrode couples said floating gate electrodes along said first direction thereby forming a row of interconnected floating gate transistors and further comprising a further row of floating gate transistors separated from said row of floating gate transistors along an orthogonal direction by said dielectric layer.

9. A method for forming floating gate transistors, said method comprising:

forming a dielectric layer over a substrate, said dielectric layer including oxide portions and nitride portions, said nitride portions and oxide portions having coplanar upper surfaces;

recessing said oxide portions in a first region that includes said nitride portions such that said nitride portions protrude above recessed oxide portions in said first region;

after said recessing, removing sections of said nitride portions to form two-tiered openings in said oxide portions in said first region;

forming a tunnel oxide on said substrate on respective bottoms of said two-tiered openings;

depositing polysilicon over said dielectric layer and said tunnel oxide and filling said two-tiered openings;

polishing to remove said polysilicon from over a top surface of said dielectric layer, thereby forming floating gate electrodes in said two-tiered openings;

forming a recess in each said floating gate electrode, each said recess including sidewalls and a bottom surface within said floating gate electrode;

forming a floating gate dielectric layer along said sidewalls and said bottom surface of each of said recesses; and forming a control gate electrode on said floating gate dielectric layer and filling each of said recesses.

10. The method as in claim 9, wherein each said two-tiered opening comprises a centrally disposed lower portion having a bottom terrace and an upper terrace adjacent said centrally disposed lower portion.

11. The method as in claim 9, wherein forming a recess in each said floating gate electrode comprises patterning and etching said polysilicon after said polishing.

12. The method as in claim 9, wherein said forming said dielectric layer includes forming said discrete nitride portions by patterning a nitride layer then depositing said oxide over said substrate and said discrete nitride portions using HDP (high density plasma) and thereafter polishing to form said coplanar upper surfaces.

13. The method as in claim 9, wherein said removing sections of said nitride portions includes forming a masking pattern over said dielectric layer wherein said sections of said nitride portions are not covered by said masking pattern, and etching to selectively remove said sections of said nitride portions, wherein further nitride portions covered by said masking pattern remain unremoved.

14. The method as in claim 13, comprising implanting dopant impurities into said substrate between said discrete nitride portions using at least one of a barrier diffusion implant and a large angle tilt implanted drain (Latid) implant, prior to said then depositing said oxide over said substrate.

15. The method as in claim 9, wherein said forming a floating gate dielectric layer comprises forming an oxide layer, forming a nitride layer over said oxide layer and forming a further oxide layer over said nitride layer.

16. The method as in claim 9, wherein said forming a floating gate dielectric layer comprises forming an oxide layer, forming a nitride layer over said oxide layer and forming a further oxide layer over said nitride layer.

17. The method as in claim 9, wherein said control gate electrode couples more than one of said floating gate electrodes.

18. The method as in claim 9, wherein said floating gate electrodes are laterally separated along a first direction by said dielectric layer, said control gate electrode couples said floating gate electrodes along said first direction thereby forming a row of interconnected floating gate transistors and further comprising a further row of floating gate transistors separated from said row of floating gate transistors along an orthogonal direction by said dielectric layer.

* * * * *